US007245548B2

(12) United States Patent
Derner et al.

(10) Patent No.: US 7,245,548 B2
(45) Date of Patent: Jul. 17, 2007

(54) TECHNIQUES FOR REDUCING LEAKAGE CURRENT IN MEMORY DEVICES

(75) Inventors: Scott J. Derner, Boise, ID (US); Venkatraghavan Bringivijayaraghavan, Boise, ID (US); Abhay S. Dixit, Boise, ID (US); Scot M. Graham, Boise, ID (US); Stephen R. Porter, Boise, ID (US); Ethan A. Williford, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 354 days.

(21) Appl. No.: 10/900,246

(22) Filed: Jul. 27, 2004

(65) Prior Publication Data

US 2006/0023542 A1     Feb. 2, 2006

(51) Int. Cl.
G11C 7/00 (2006.01)
(52) U.S. Cl. ............. 365/229; 365/230.06; 365/189.11
(58) Field of Classification Search ............... 365/229, 365/230.06, 189.11
See application file for complete search history.

(56) References Cited

U.S. PATENT DOCUMENTS

| 5,532,971 | A | * | 7/1996 | Tanaka et al. | ......... 365/230.06 |
| 5,617,369 | A | * | 4/1997 | Tomishima et al. | ..... 365/230.06 |
| 5,684,317 | A | | 11/1997 | Hwang | ......................... 257/316 |
| 6,370,069 | B2 | * | 4/2002 | Brass et al. | ................. 365/201 |
| 6,693,012 | B2 | | 2/2004 | Mouli et al. | ................. 438/302 |

OTHER PUBLICATIONS

Rahul M. Rao, et al.; Circuit Techniques for Gate and Sub-Threshold Leakage Minimization in Future CMOS Technologies; pp. 1-2.

* cited by examiner

*Primary Examiner*—David Lam
(74) *Attorney, Agent, or Firm*—Fletcher Yoder

(57) ABSTRACT

Techniques for reducing gate induced drain leakage (GIDL) in memory devices utilizing negative wordline architectures. More specifically, a method and apparatus are provided to determine whether any of the word lines in a section of a memory array are active. If any one of the plurality of word lines is active, each of the inactive word lines in the section are coupled to a negative voltage level. If none of the plurality of word lines is active, each of the plurality of word lines is coupled to ground to reduce GIDL.

28 Claims, 4 Drawing Sheets

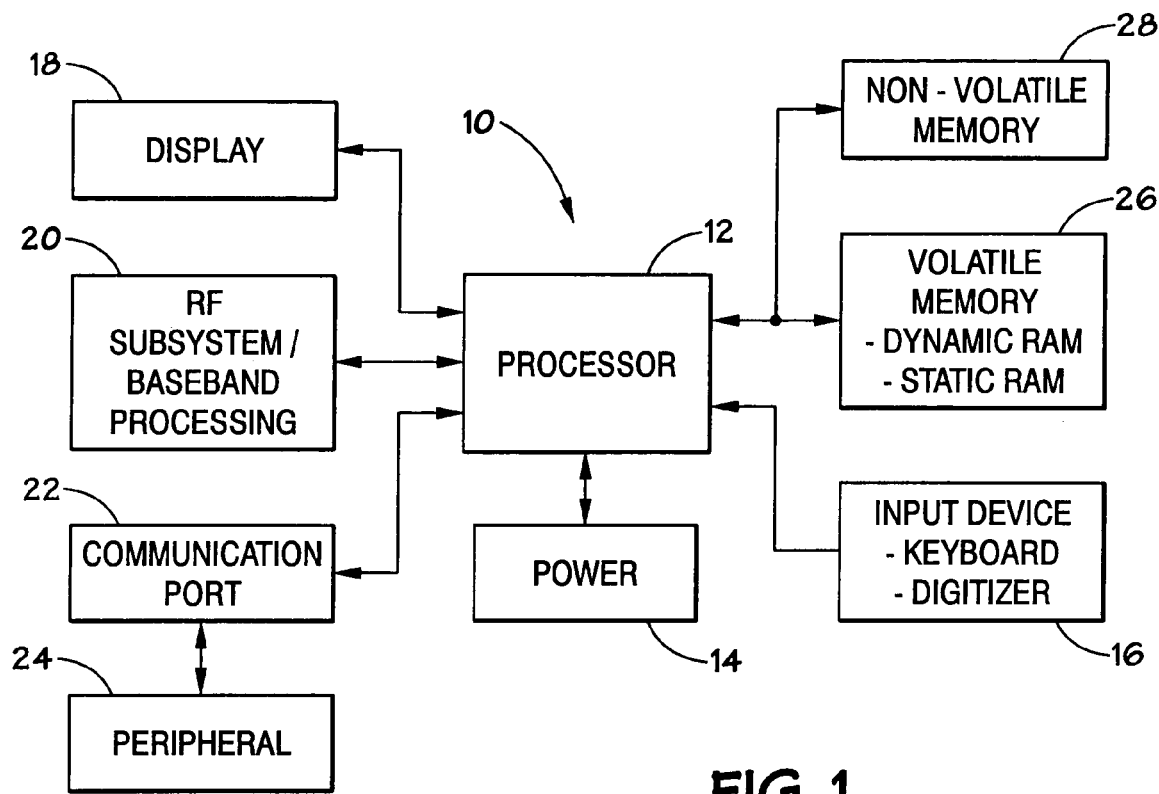
FIG. 1
FIG. 4
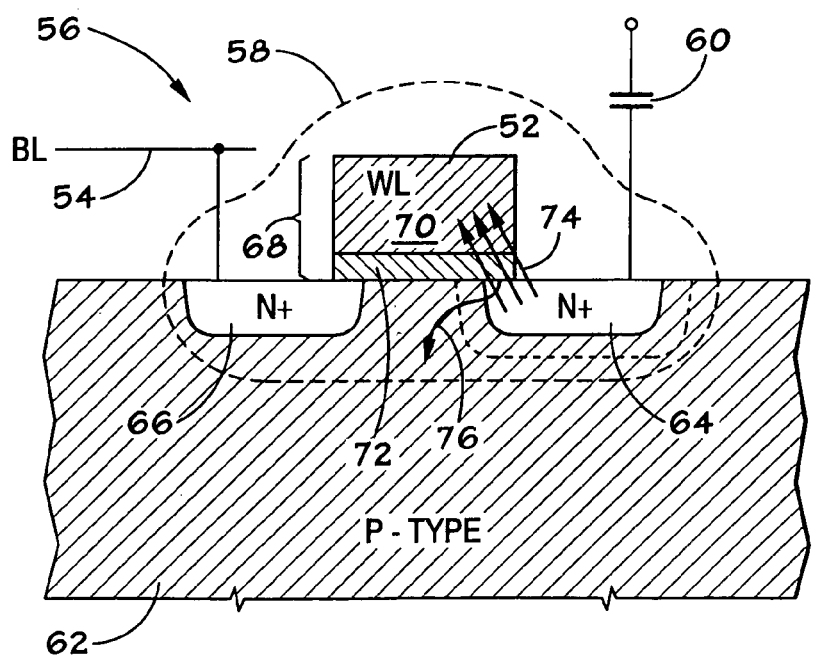

TECHNIQUES FOR REDUCING LEAKAGE CURRENT IN MEMORY DEVICES

BACKGROUND OF THE INVENTION

1. Field of the Invention

The present invention relates generally to memory devices and, more particularly, to techniques for reducing leakage current in memory devices.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In recent years, the minimization of structural dimensions in integrated circuit devices, such as memory devices fabricated using complementary metal oxide semiconductor (CMOS) technology, have led to ever-increasing sub-threshold leakage currents in the devices. The leakage current is typically produced from inherent qualities associated with the CMOS technology that is typically used to manufacture static random access memory (SRAM) and dynamic random access memory (DRAM) devices. CMOS sub-threshold leakage ($S_{VT}$), junction leakage and gate induced drain leakage (GIDL) in the memory core may negatively impact device performance. To date, most leakage mechanism techniques focus on sub-threshold leakage reduction and junction leakage, without considering the effects of gate induced leakage, since sub-threshold leakage and junction leakage are generally of greater impact on device performance.

Sub-threshold leakage refers generally to the leakage current through the channel of a CMOS transistor. For a one-transistor, one-capacitor (1T-1C) dynamic random access (DRAM) memory cell, for instance, leakage from the charge stored in the capacitor may occur through the channel. One technique for reducing the sub-threshold leakage in a CMOS transistor, is to implant the channel with an impurity, such as boron for a n-channel device. By implanting boron in the channel directly below the gate and directly adjacent to the drain, the threshold voltage ($V_T$) across the gate is increased, thereby lowering the sub-threshold leakage. However, while increasing the threshold voltage may advantageously decrease the sub-threshold leakage, the increased doping in the channel disadvantageously increases the junction leakage between the n+ doped drain region and the p-type substrate material.

Gate induced drain leakage (GIDL) is generally caused by a high gate to drain electric field in the region of the gate that overlaps the drain. As device size decreases and the thickness of the gate oxide is reduced, GIDL currents increasingly impact the total off current of the device.

Techniques for reducing GIDL are primarily implemented by introducing CMOS design level modifications. For instance, one approach for reducing GIDL currents involves symmetrical oxidation to provide a thin gate oxide through the channel of the device, but to provide a thicker gate oxide in the regions of the gate-source and gate-drain overlap. The thick gate oxide in the gate-drain region reduces the GIDL. However, having a thick gate oxide in the gate-source region increases the $V_T$ which generally reduces current driving capabilities of the device. Another approach to reducing GIDL currents is asymmetrical oxidation such that the gate oxide is thicker only in the gate-drain region. The material thickness of the oxide layer in gate-drain region is increased by implanting an oxidation accelerating material, such as chlorine or fluorine to physically grow a thicker gate oxide layer in that particular region. Due to the presence of the oxidation accelerating material, the oxide layer in the gate-drain region grows faster than in the remaining portions of the substrate. However, as with the symmetrical oxidation, having an increased material thickness of the oxide layer in the gate-drain region dampers current driving capability of the device and also causes increased stress in the active area near the overlap region due to the volume expansion.

Further, implementing structural changes to the design of the device layers may introduce other variables that may ultimately negatively impact device performance. Implementing such changes may also be impractical in current manufacturing facilities.

The present invention may address one or more of the problems set forth above.

BRIEF DESCRIPTION OF THE DRAWINGS

The foregoing and other advantages of the invention may become apparent upon reading the following detailed description and upon reference to the drawings in which:

FIG. 1 illustrates a block diagram of an exemplary processor-based device;

FIG. 4 illustrates a partial cross-sectional view, partial schematic of an exemplary memory cell in the memory array of FIG. 3 that may be configured in accordance with the present techniques.

DETAILED DESCRIPTION OF SPECIFIC EMBODIMENTS

Figure 2:
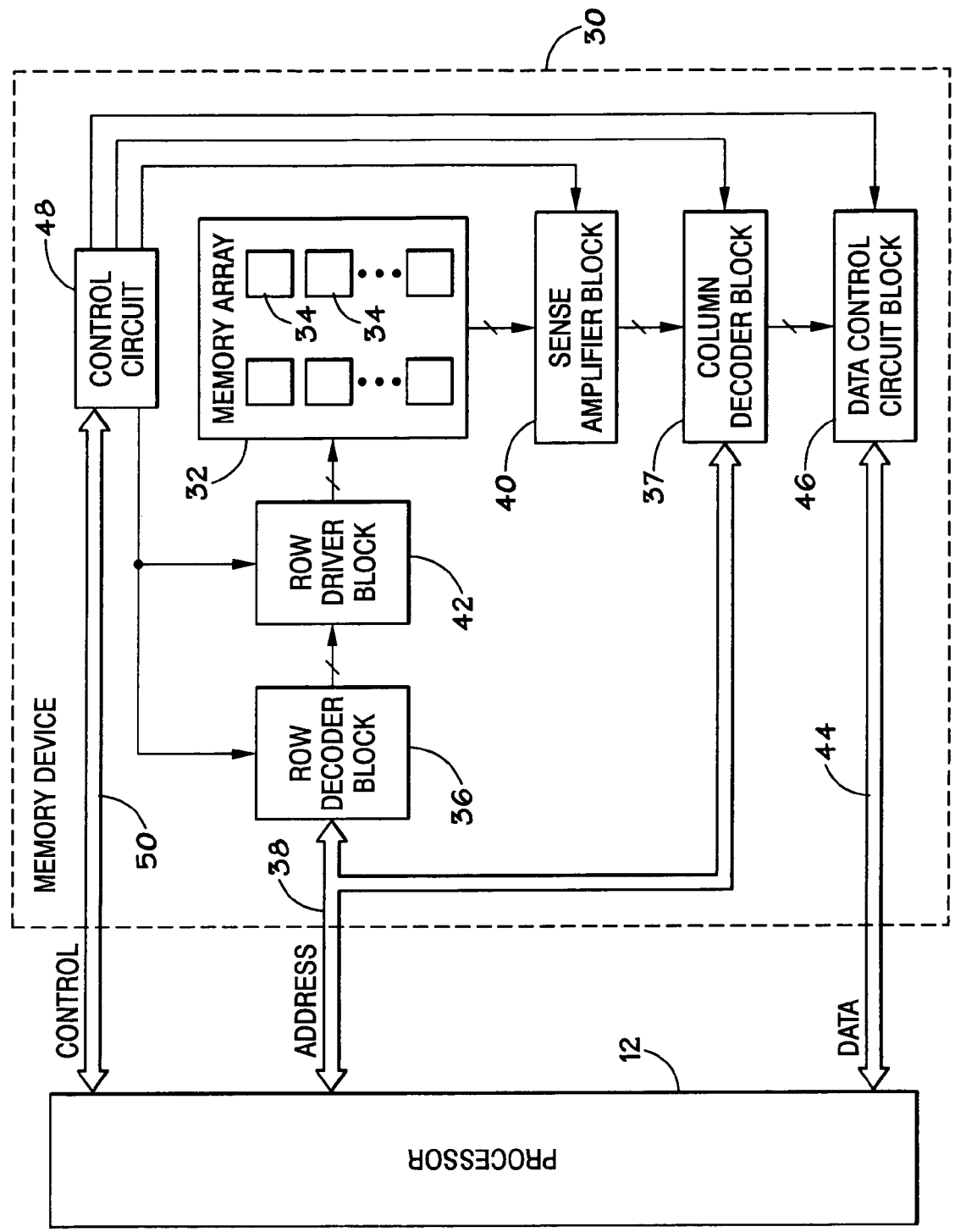
FIG. 2 illustrates a block diagram of an exemplary memory device that may be configured in accordance with the present techniques.

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to the volatile memory 26 which may include Dynamic Random Access Memory (DRAM) and/or Static Random Access Memory (SRAM). The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. The volatile memory 26 on the other hand, is typically quite large so that it can store dynamically loaded applications and data. Additionally, the non-volatile memory 28 may include a high capacity memory such as a tape or disk drive memory.

FIG. 2 is a block diagram illustrating a memory device 30 that may be implemented in the volatile memory 26 of FIG. 1. The memory device 30 generally includes a memory array 32. The memory array 32 generally includes many rows and columns of conductive traces arranged in a grid pattern to form a number of memory cells. The rows or "row lines" that make up the memory array 32 are generally referred to as "wordlines." The columns or "column lines" are generally referred to as "bit lines" or "digit lines." Each column may actually comprise a pair of complimentary bit lines, as will be further illustrated with respect to FIG. 3. As described further below, the memory array 32 may include a number of sub arrays or sections 34. In one embodiment, 64 sub arrays or sections 34, each having 512 rows and columns may be used to form a 16 Mb array. As will be appreciated, four of the 16 Mb arrays may be combined to form a 64 Mb DRAM, for instance.

To access the memory array 32, a row decoder block 36 and a column decoder block 37 are provided and are configured to receive and translate address information from the processor 12 via the address bus 38 to access a particular memory cell in the memory array 32. A sense amplifier block 40 having a plurality of the sense amplifies (one sense amplifier for each bit line pair, for example) is also provided between the column decoder 37 and the memory array 32 to sense and amplify individual values stored in the memory cells. Further, a row driver block 42 is provided between the row decoder block 36 and the memory array 32 to activate a selected word lines in the memory array according to a given row address. In accordance with embodiments of the present invention, the row driver block 42 may be configured such that gate induced drain leakage (GIDL) is advantageously reduced, as further described below with reference to FIGS. 3 and 4.

During read and write operations, data may be transferred to and from the memory device 30 via the data bus 44. The data bus 44 may be a 16-bit data bus configured to carry data at 400 MHz, for example. The coordination of the data and address information may be conducted through a data control circuit block 46. Finally, the memory device 30 may include a control circuit 48 configured to receive control signals from the processor 12 via the control bus 50. The control circuit 48 is coupled to each of the row decoder block 36, the column decoder block 37, the sense amplifier block 40, the row driver block 42 and the data control circuit block 46, and is generally configured to coordinate timing and control among the various circuits in the memory device 30.

Figure 3:
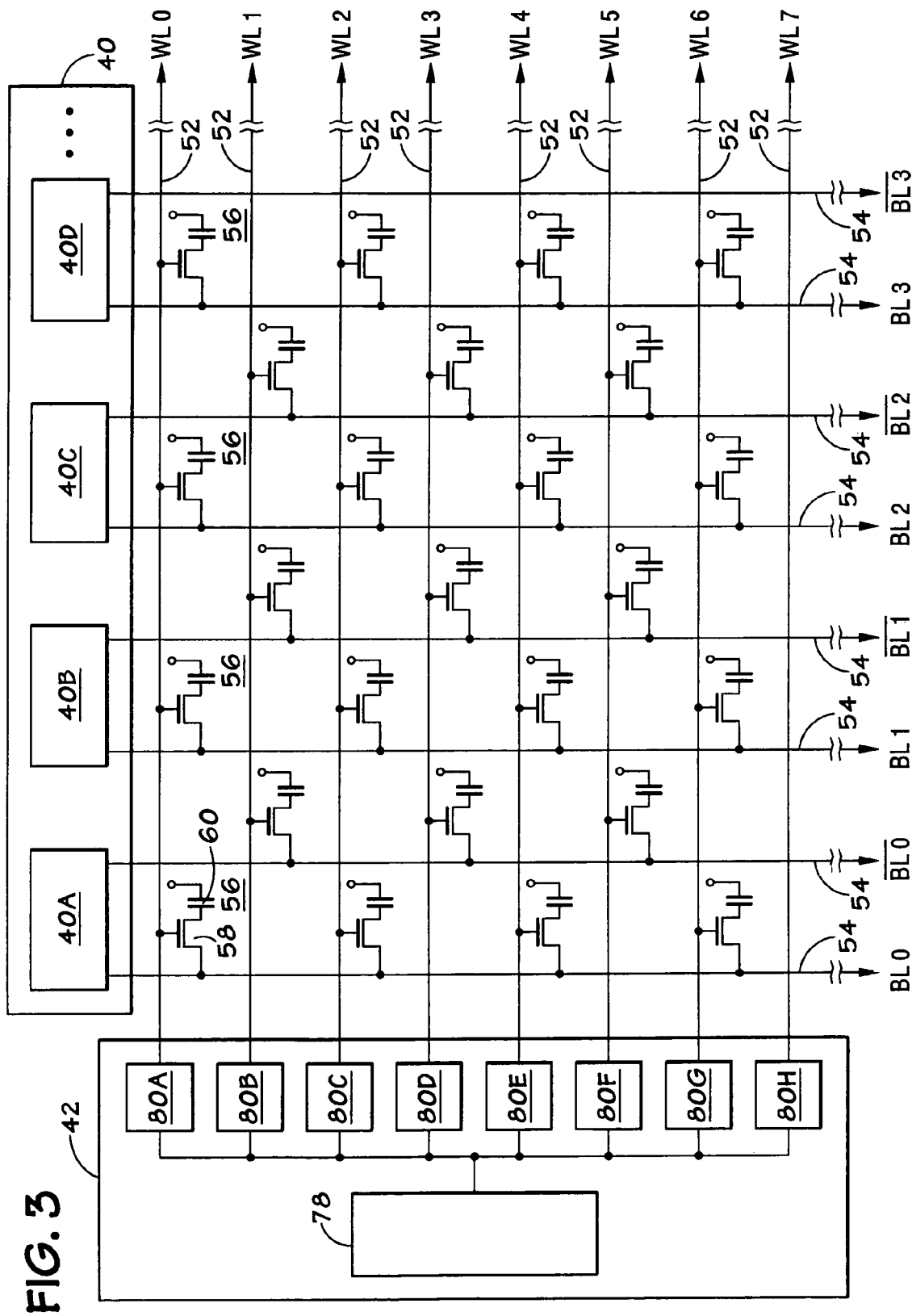
FIG. 3 illustrates a block diagram of an exemplary memory array in the memory device of FIG. 2 that may be configured in accordance with the present techniques.

Referring now to FIG. 3, a portion of a sub array or section 34 of the memory array 32 is illustrated. In particular, FIG. 3 illustrates a portion of a dynamic random access memory (DRAM) array. As previously described, the section 34 of the memory array 32 includes a number of word lines 52 and a number of complimentary bit lines 54. The bit lines 54 are generally arranged such that complimentary bit line pairs are coupled to a respective sense amplifier in the sense amplifier block 40. Specifically in the portion of the section 34 of the memory array 32 illustrated in FIG. 3, complimentary bit line pairs BL0 and $\overline{BL0}$ are coupled to the sense amplifier 40A. Complementary bit lines BL1 and $\overline{BL1}$ are coupled to the sense amplifier 40B. Bit line pairs BL2 and $\overline{BL2}$ are coupled to the sense amplifier 40C, and bit line pairs BL3 and $\overline{BL3}$ are coupled to the sense amplifier 40D.

As previously described, the word lines 52 and the bit lines 54 are arranged in a grid pattern to provide an array of individual memory cells 56. Each memory cell 56 may include an access device, such as a transistor 58, and a storage device, such as a capacitor 60. The transistor 58 of the memory cell 56 may be a metal-oxide semiconductor field effect transistor (MOSFET), complementary metal-oxide-semiconductor transistor (CMOS) or any other suitable transistor. Further, the transistor 58 may be an n-channel or a p-channel device, depending on the specific design.

The drain terminal of the transistor 58 is connected to one terminal of the capacitor 60. The source terminal of the transistor 58 is coupled to a bit line 54. As will be appreciated, depending on the mode of operation of the transistor 58, the source and drain terminals may be reversed. The gate of the transistor 58 is coupled to a respective word line 52.

To store information in a memory cell 56, via an electrical charge, a first voltage is applied to the word line 52 and to the gate of the transistor 58. The voltage applied to the gate of the transistor 58 opens the transistor to allow a second voltage applied to a bit line 54 to flow through the transistor 58 and into the capacitor 60. Accordingly, the capacitor 60 stores the charge that was applied to the bit line 54 when a voltage is applied to the word line 52 to open the gate of the transistor 58, as will be appreciated by those skilled in the art.

Referring briefly to FIG. 4, a partial cross-sectional view, partial schematic of the memory cell 56 is illustrated. The memory cell 56 may be fabricated on a p-type substrate 62, having n+ doped regions which form the drain terminal 64 and the source terminal 66 of the transistor 58 (illustrated in FIG. 4 by dashed lines). As will be appreciated, the word line 52 is configured to form the gate 68 of the transistor 58. The gate 68 includes a conductive layer 70 and a gate oxide layer 72. The source terminal 66 is coupled to a bit line 54, and the drain terminal 64 is coupled to the capacitor 60.

As previously described, to improve the sub-threshold leakage, boron (or any other suitable p-type impurity) is often implanted in the substrate 62, directly below the gate oxide layer 72 and adjacent to the drain terminal 64. While the addition of boron may improve the sub-threshold leakage, it negatively impacts (increases) the junction leakage. In considering the amount of boron to add to the substrate, the tradeoffs between the sub-threshold leakage and the junction leakage become relevant.

One such technique to allow an acceptable amount of sub-threshold leakage and junction leakage is to reduce the boron concentration in the channel and compensate for the increased sub-threshold leakage by taking the gate to drain potential of the transistor negative. To increase the voltage potential across the drain-gate, more electron-hole pairs are created, thereby providing a stronger E field (indicated by electric field lines 74 in FIG. 4) between the drain terminal 64 and the gate 68. To increase the voltage potential between the drain terminal 64 and the gate 68 when the word line 52 is off, the word line 52 may be driven to a negative voltage, such as −0.3 volts, rather than to ground. By driving the gate 68 to a negative voltage, the E-field 74 is increased and the voltage potential across the drain-gate is increased. While this provides desirable effects in reducing the sub-threshold leakage while the word line 52 is inactive, it disadvantageously increases the GIDL, generally indicated by reference numeral 76. In accordance with embodiments of the present inventions, an improved row driver block 42 from reducing the GIDL 76 in memory devices implementing negative word lines architectures.

Referring again to FIG. 3, a block diagram of the row driver block 42, in accordance with embodiments of the present invention, is generally illustrated. A schematic diagram illustrating an exemplary embodiment will be described further below with reference to FIG. 5. Generally, the row driver block 42 includes a voltage selection circuit 78 which is configured to selectably couple any of the word lines 52 to either of a first voltage level, such as a negative voltage level, or a second voltage level, such as ground, when each of the word lines 52 in the memory section or sub array 34 is inactive. The negative voltage level may be −0.3 volts, for example. The row driver block 42 may also include a level translator 80A–80H, wherein each word line 52 includes a corresponding level translator 80A–80H.

By coupling all of the word lines 52 in a sub array 34 to ground, rather than a negative voltage, when all of the word lines are inactive, such as in a standby mode or a static refresh mode, for example, the GIDL effect that the off word lines have on the storage node in alleviated and the refresh performance is improved. Sub-threshold leakage is of less concern when each of the word lines 52 is inactive, because the inactive transistors only have a $V_{CC}/2$ voltage stress across the source to drain junction.

In contrast, if a word line 52 in the sub array 34 is active, such as during ACT mode or long RAS mode, all of the inactive word lines 52 are coupled to the negative word line voltage. By connecting the inactive word lines 52 to the negative voltage if a word line 52 in the sub array 34 is active, sub-threshold leakage across the access device is prevented since the voltage stress across the source-to-drain junction is $V_{CC}$. During this time, the memory cells that are not being accessed may still experience reduced refresh performance due to the GIDL effects.

Figure 5:
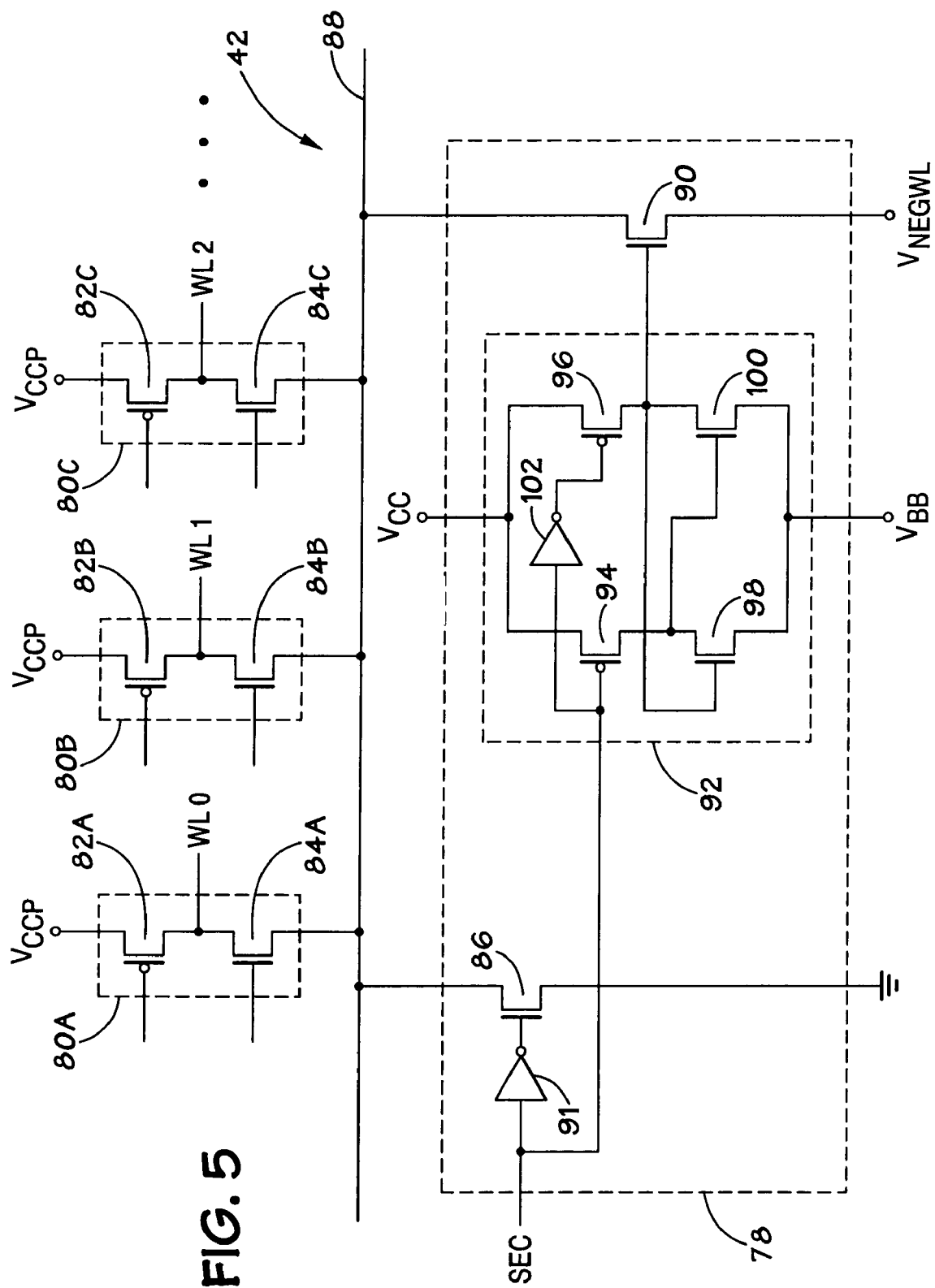
FIG. 5 illustrates a schematic diagram of an exemplary embodiment of a portion of a row driver block for improving gate induced drain leakage (GIDL), in accordance with embodiments of the present techniques.

Referring now to FIG. 5, a schematic diagram of an exemplary embodiment of the portion of the row driver block 42 for improving GIDL, in accordance with the present techniques, is illustrated. As described above, the row driver block 42 includes a voltage selection circuit 78 for each section 34 of the memory array 32 and a plurality of level translators (e.g., 80A–80C), wherein each of the word lines (e.g., WL0–WL2) is coupled to a corresponding level translator. For simplicity, only three level translators 80A–80C and corresponding word lines WL0–WL2 are illustrated. However, as will be appreciated, the memory section 34 (FIG. 2) may include any number of word lines, such as 512 word lines. Further, in an alternate exemplary embodiment, the level translators 80A–80C may be omitted.

In the present exemplary embodiment, each level translator 80A–80C comprises a corresponding pair of p-channel and n-channel transistors, 82A–82C and 84A–84C, respectively. Each p-channel transistor 82A–82C is coupled to the a positive voltage source $V_{CCP}$ which enables the active mode on the respective word line WL0–WL2. As will be appreciated, $V_{CCP}$ is generally about 1.5 volts higher than $V_{CC}$. In the present exemplary embodiment, $V_{CC}$ is equal to approximately 2.0 volts and $V_{CCP}$ is approximately equal to 3.5 volts.

The voltage selection circuit 78 receives a section signal SEC, which is implemented to indicate whether any of the word lines WL0–WL2 in the corresponding section 34 of the memory array 32 are active. The section signal SEC is high if any of the word lines WL0–WL2 in the section 34 are active and low if none of the word lines WL0–WL2 are active (i.e., all word lines are inactive). If all of the word lines WL0–WL2 in a section 34 are inactive (SEC=0), the voltage selection circuit 78 is configured to drive each of the word lines WL0–WL2 to ground. If any one of the word lines WL0–WL2 in the section 34 is active (SEC=1), the voltage selection circuit 78 is configured to drive each of the inactive word lines WL0–WL2 to $V_{NEGWL}$. In the present exemplary embodiment, $V_{NEGWL}$ is approximately equal to −0.3 volts.

The present exemplary embodiment of the voltage selection circuit 78 includes a pull-down transistor 86, coupled between the common node 88 and ground and a pull-down transistor 90, coupled between the common node 88 and the negative word line voltage $V_{NEGWL}$. The gate of the pull-down transistor 86 receives the inverse of the section signal SEC through the inverter 91. The voltage selection circuit 78 also includes a voltage translator 92 coupled between the positive voltage $V_{CC}$ (e.g., 2.0 volts) and a negative substrate voltage $V_{BB}$ (e.g., −1.0 volts). The voltage translator 92 includes a pair of p-channel transistors 94 and 96, a pair of n-channel transistors 98 and 100 and an inverter 102. The voltage translator 92 is configured to convert ground to the negative substrate voltage $V_{BB}$. If the input of the voltage translator 92 receives $V_{CC}$, the output of the voltage translator 92, which is coupled to the gate of the pull-down transistor 90, receives the voltage $V_{CC}$. If the input of the voltage translator 92 is grounded, the output of the voltage translator 92 is the negative substrate voltage $V_{BB}$. As will be appreciated, the negative substrate voltage $V_{BB}$ (e.g., −1.0 volts) is more negative than the negative word line voltage $V_{NEGWL}$ (e.g., −0.3 volts), the gate of the pull-down resistor 90 is driven to −0.3 volts, depending on the state of the section signal SEC (i.e., if the SEC=1).

As described above, the section signal SEC is used to determine whether the inactive word lines WL0–WL2 in the section 34 are to be coupled to ground (through the pull-down transistor 86) or to the negative word line voltage $V_{NEGWL}$ through the pull-down resistor 90). If the section signal SEC is enabled (high), then one of the word lines WL0–WL2 in the section 34 is active and the inactive word lines WL0–WL2 in the section 34 are coupled to the negative word line voltage $V_{NEGWL}$. If the section signal SEC is disabled (low), then all of the word lines WL0–WL2 in the section 34 are inactive and all of the word lines WL0–WL2 in the section 34 are coupled to ground.

As will be appreciated, the state of the section signal SEC may also be determined by the mode of operation of the memory device. If the array is in a standby mode or a static refresh mode, the section signal SEC will be low (SEC=0), and all of the word lines WL0–WL2 in the section 34 are driven to ground. If the array is in an active mode or a long RAS low mode, the section signal SEC will be high (SEC=1), and all of the inactive word lines WL0–WL2 in the section 34 are driven to the negative word line voltage $V_{NEGWL}$.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of reducing leakage current in a memory device comprising:
   determining whether each one of a plurality of word lines in a section of a memory array is active or inactive;
   if any one of the plurality of word lines is active, coupling each of the inactive word lines to a first voltage level through a first pull-down device, wherein coupling each of the inactive word lines to the first voltage level through the first pull-down device comprises supplying a negative substrate voltage to a gate of the first pull-down device through a voltage translator; and
   if none of the plurality of word lines is active, coupling each of the plurality of word lines to a second voltage level through a second pull-down device, and supplying a positive voltage to the gate of the first pull-down device.

2. The method, as set forth in claim 1, wherein the second voltage level is higher than the first voltage level.

3. The method, as set forth in claim 1, wherein if any one of the plurality of word lines is active, coupling each of the inactive word lines to a negative voltage level.

4. The method, as set forth in claim 1, wherein if any one of the plurality of word lines is active, coupling each of the inactive word lines to approximately −0.3 volts.

5. The method, as set forth in claim 1, wherein if none of the plurality of word lines is active, coupling each of the plurality of word lines to ground.

6. The method, as set forth in claim 1, wherein coupling each of the inactive word lines to a first voltage level comprises driving each of the inactive word lines to a first voltage level.

7. The method, as set forth in claim 1, wherein coupling the plurality of word lines to a second voltage level comprises driving each of the word lines to a second voltage level.

8. A method of reducing leakage current in a memory array comprising:
   determining whether the memory array is in one of a static refresh mode and a standby mode;
   if the memory array is not in one of the static refresh mode and the standby mode, coupling each of the inactive word lines to a first voltage level through a first pull-down device, wherein coupling each of the inactive word lines to the first voltage level through the first pull-down device comprises supplying a negative substrate voltage to a gate of the first pull-down device through a voltage translator; and
   if the memory array is in one of the static refresh mode and the standby mode, coupling each of the plurality of word lines to a second voltage level through a second pull-down device, and supplying a positive voltage to the gate of the first pull-down device through the voltage translator.

9. The method, as set forth in claim 8, wherein the second voltage level is higher than the first voltage level.

10. The method, as set forth in claim 8, wherein if the memory array is not in one of the static refresh mode and the standby mode, coupling each of the inactive word lines to a negative voltage level.

11. The method, as set forth in claim 8, wherein if the memory array is not in one of the static refresh mode and the standby mode, coupling each of the inactive word lines to approximately −0.3 volts.

12. The method, as set forth in claim 8, wherein if the memory array is in one of the static refresh mode and the standby mode, coupling each of the plurality of word lines to ground.

13. The method, as set forth in claim 8, wherein coupling each of the inactive word lines to a first voltage level comprises driving each of the inactive word lines to a first voltage level.

14. The method, as set forth in claim 8, wherein coupling the plurality of word lines to a second voltage level comprises driving each of the word lines to a second voltage level.

15. A memory device comprising:
   a section of a memory array, wherein the section has a plurality of word lines;
   a voltage selection circuit coupled to each of the plurality of word lines, wherein the voltage selection circuit comprises:
      a first pull-down device configured to couple the inactive word lines to a first voltage level; and
      a second pull-down device configured to couple the inactive word lines to a second voltage level; and
   a voltage translator coupled to the input of the second pull-down device and configured to supply either of a positive voltage or a negative substrate voltage, depending on whether any of the plurality of word lines in the section are active.

16. The memory device, as set forth in claim 15, wherein the first voltage level is a ground voltage level and the second voltage level is a negative voltage level.

17. The memory device, as set forth in claim 15, wherein the voltage selection circuit is configured to couple the inactive word lines to the first voltage level if any one of the plurality of word lines in the section is active and configured to couple the inactive word lines to the second voltage level if none of the plurality of word lines is active.

18. The memory device, as set forth in claim 15, wherein the voltage selection circuit is configured to couple the inactive word lines to the first voltage level if the memory array is not in one of a standby mode and a static refresh mode and configured to couple the inactive word lines to the second voltage level if the memory array is in one of the standby mode and the static refresh mode.

19. The memory device, as set forth in claim 15, comprising a plurality of level translators, wherein each of the plurality of level translators is coupled to a respective one of the plurality of word lines.

20. A system comprising:
a processor; and
a memory device coupled to the processor and comprising:
a section of a memory array, wherein the section has a plurality of word lines;
a voltage selection circuit coupled to each of the plurality of word lines, wherein the voltage selection circuit comprises:
a first pull-down device configured to couple the inactive word lines to a first voltage level; and
a second pull-down device configured to couple the inactive word lines to a second voltage level; and
a voltage translator coupled to the input of the second pull-down device and configured to supply either of a positive voltage or a negative substrate voltage, depending on whether any of the plurality of word lines in the section are active.

21. The system, as set forth in claim 20, wherein the first voltage level is a ground voltage level and the second voltage level is a negative voltage level.

22. The system, as set forth in claim 20, wherein the voltage selection circuit is configured to couple the inactive word lines to the first voltage level if any one of the plurality of word lines in the section is active and configured to couple the inactive word lines to the second voltage level if none of the plurality of word lines is active.

23. The system, as set forth in claim 20, wherein the voltage selection circuit is configured to couple the inactive word lines to the first voltage level if the memory array is not in one of a standby mode and a static refresh mode and configured to couple the inactive word lines to the second voltage level if the memory array is in one of the standby mode and the static refresh mode.

24. The system, as set forth in claim 20, comprising a plurality of level translators, wherein each of the plurality of level translators is coupled to a respective one of the plurality of word lines.

25. A method of operating a memory device comprising a memory array, comprising:
receiving a section signal at the memory device, wherein the section signal is enabled if any word line in the memory array is active and wherein the section signal is disabled if none of the word lines in the memory array is active;
coupling inactive word lines of the memory array to a first voltage level through a first pull-down device if the section signal is enabled, wherein coupling each of the inactive word lines to the first voltage level through the first pull-down device comprises supplying a negative substrate voltage to a gate of the first pull-down device; and
coupling the inactive word lines of the memory array to a second voltage level through a second pull-down device if the section signal is disabled, and supplying a positive voltage to the gate of the first pull-down device.

26. The method, as set forth in claim 25, wherein coupling the inactive word lines of the memory array to a first voltage level comprises coupling the inactive word lines to a negative voltage level.

27. The method, as set forth in claim 25, wherein coupling the inactive word lines of the memory array to a first voltage level comprises coupling the inactive word lines to approximately −0.3 volts.

28. The method, as set forth in claim 25, wherein coupling the inactive word lines of the memory array to a second voltage level comprises coupling the inactive word lines to ground.

* * * * *